United States Patent [19]

Jeannotte et al.

[11] 3,829,601

[45] Aug. 13, 1974

[54] INTERLAYER INTERCONNECTION TECHNIQUE

[75] Inventors: Dexter A. Jeannotte, Clinton Corners; Alfred H. Johnson, Poughkeepsie, both of N.Y.

[73] Assignee: International Business Machines Corporation, Armonk, N.Y.

[22] Filed: Mar. 12, 1973

[21] Appl. No.: 340,483

Related U.S. Application Data

[63] Continuation of Ser. No. 189,416, Oct. 14, 1971, abandoned.

[52] U.S. Cl. .................... 174/68.5, 29/625, 29/628, 317/101 CM, 317/101 D, 339/17 M, 339/278 C

[51] Int. Cl. .................... H05k 3/36

[58] Field of Search . 174/68.5; 317/101 B, 101 CC, 317/101 CM, 101 D; 339/275 B, 278 C, 17 C, 17 M, 17 N; 29/625, 628

[56] References Cited

UNITED STATES PATENTS 3,193,789 7/1965 Brown .................... 174/68.5 X 3,233,034 2/1966 Grabbe .................... 174/68.5

FOREIGN PATENTS OR APPLICATIONS 1,136,753 12/1968 Great Britain .................... 174/68.5

OTHER PUBLICATIONS

Chapman et al., "Microelectronic Packaging Technique" IBM Technical Disclosure Bulletin, Vol. 6, No. 10, March, 1964, pp. 70.

*Primary Examiner*—Darrell L. Clay
*Attorney, Agent, or Firm*—William J. Dick; Kenneth R. Stevens

[57] ABSTRACT

An interconnection substrate for electrical circuits comprising a plurality of planar conductive metallized patterns disposed between alternating layers of a dielectric medium, and substantially normal thereto electrically conductive paths extending between at least some of said conductive metallized patterns. Diffused metallurgical bond interfaces provide mechanical and electrical connection between the conductive metallized patterns and paths.

11 Claims, 3 Drawing Figures

INVENTORS
DEXTER A. JEANNOTTE
ALFRED H. JOHNSON
BY Kenneth R. Stevens
ATTORNEY

INTERLAYER INTERCONNECTION TECHNIQUE

This is a continuation of application Ser. No. 189,416 filed Oct. 14, 1971, now abandoned.

BACKGROUND OF THE INVENTION

This invention relates to an electrical interconnection substrate or package for integrated circuits.

As described in U.S. Pat. No. 2,872,391, Hauser et al., assigned to the same assignee as the present invention, it is well-known to punch or drill via holes in integrated circuit interconnection packages. In this type of package, the overall thickness may run in the order of 16 mils. The basic substrate is fabricated to the desired overall thickness and includes a plurality of planar interleaved metallized patterns or planes. The vertical conductive paths are formed by drilling via holes followed by plating of the holes. Inherent in the mechanical drilling operation is the problem of "drill walking." Due to this problem, it is necessary to drill an oversized hole in order to be able to manufacture a completed plated-through via hole having the precise desired dimensions and center location.

Another limitation relating to mechanical drilling techniques exists in connection with what is known as the aspect ratio. This ratio signifies hole height to hole diameter. Even within the most sophisticated equipment, it is not possible to obtain aspect ratios much better than in the range of 6, while maintaining precise dimensions and center locations. Thus, by way of example, the mechanical drilling of 2 mil via hole grid, in a 16 mil thick board introduces unsuitable and undesirable tolerance variations. It is thus apparent that the mechanical "drill walking" problem and the aspect ratio limitations connected with mechanical drilling of electrical interconnection boards constitutes constraint in the manufacturing of high density plus high performance electrical interconnection packages.

SUMMARY OF THE INVENTION

Therefore, it is an object of the present invention to provide an interconnection substrate of any desired thickness while minimizing the area consumed by vertical plated-through via holes.

It is another object of the present invention to provide an interconnection substrate with via holes positioned and dimensioned exactingly.

Another object of the present invention is to provide an interconnection substrate having excellent structural integrity and in which the dielectric medium separating the plurality of planar conductive patterns is readily variable in accordance with the desired impedance or dielectric properties.

The present invention describes a method and resulting structure relating to a diffusion bonding interface to join conductive patterns, vertical and horizontal, by a low temperature diffusion to form a final high temperature-high strength bond.

DESCRIPTION OF THE PREFERRED EMBODIMENT

Figure 1:
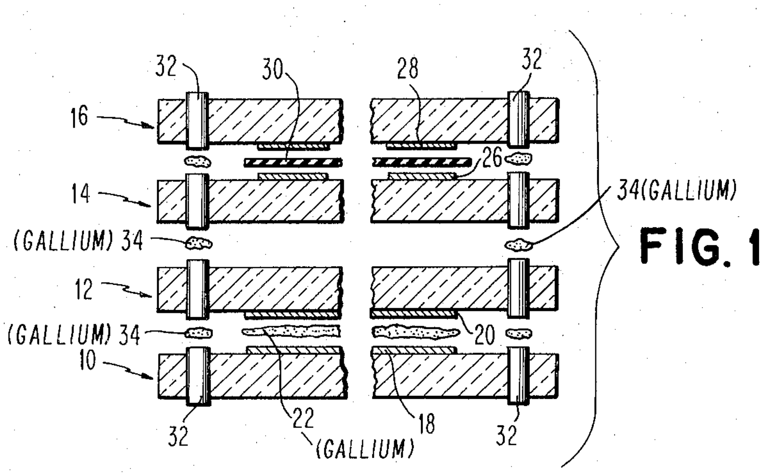
FIG. 1 shows a laminated electrical interconnection board in an exploded and cross-sectional view, and illustrates the diffusion bonding structure between planar metallized lines and the vertical interconnection via conductive paths.

FIG. 1 illustrates an electrical interconnection package comprising a plurality of laminated dielectric insulating layers 10, 12, 14 and 16. Well-known materials, such as epoxy glass, are suitable as the dielectric materials for the segmented sections 10, 12, 14 and 16.

An electrical ground plane connection comprises copper layers 18 and 20 sandwiching a gallium layer schematically illustrated at 22. The gallium interface layer 22 provides an adequate electrical interconnection between the ground plane copper layers 18 and 20 and also provides mechanical bonding so as to add structural integrity between members 10 and 12.

A pair of signal or electrical interconnection patterns are illustrated at 26 and 28. In this specific embodiment, an insulating layer 30 comprising any suitable insulating material is interposed between the signal planes 26 and 28. The conductive patterns 18, 20, 26 and 28 can be readily deposited by many well-known techniques, for example, as taught in the previously mentioned U.S. Pat. No. 2,872,391. Of course, in the case of the signal planes 26 and 28, a personalization step, such as selective etching, is employed to define the desired circuit interconnection pattern, unnecessary when the conductive pattern is simply used as a ground plane, as illustrated at 18 and 20.

Vertical conductive paths through the interconnection package are provided by the plurality of studs 32 or plated-through via holes extending through each of the segmented sections 10, 12, 14 and 16. Mechanical bonding and electrical interconnection between the plurality of studs is provided by a diffused metallurgical bonding interface material illustrated at 34. In the preferred embodiment, gallium is employed for this purpose.

Figure 2:
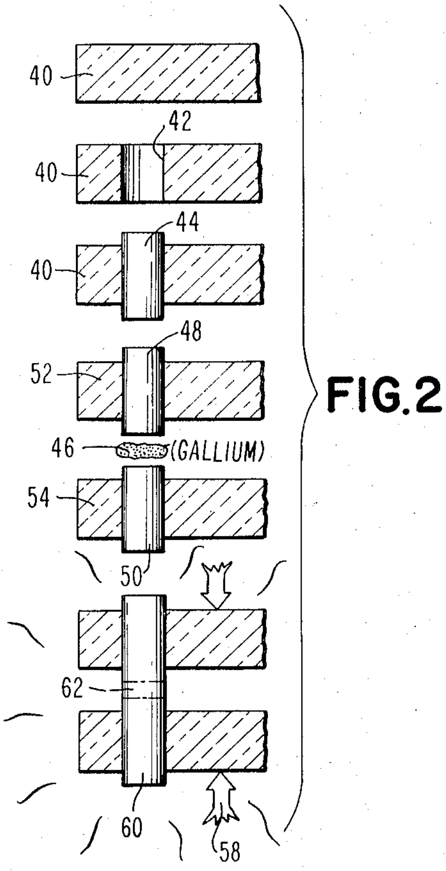
FIG. 2 illustrates the sequential steps employed in the diffusion bonding technique of a laminated electrical circuit interconnection package or board.
Figure 3:
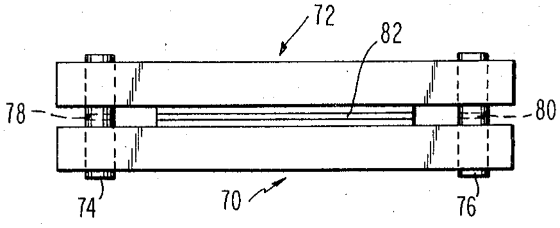
FIG. 3 shows two layers of a laminated circuit board and illustrates the manner in which the dielectric material separating the conductive planes can be readily selected in accordance with the desired circuit package impedance specifications.

Now referring to FIG. 2, it illustrates the sequential process steps employed to form an electrical interconnection package by employing a low temperature diffusion bonding process. The segmented sections, such as illustrated in FIG. 1 at 10, 12, 14 and 16 can be selected of any minimum thickness and then stacked to provide any overall desired dimension.

Any suitable laminated structure 40, such as epoxy glass, ceramic, quartz, polyamide glass, or Teflon is selected as the segmented section. Next, a hole 42 is formed in the section 40 at predetermined locations to form the desired interconnection grid.

Then, a suitable electrical conductive material, for example copper, is plated in the hole 42 to provide a vertical stud 44 at the desired locations.

Next, a pair of segmented sections having the desired plated via studs formed therein, and any desired horizontal metallized pattern (not shown) are joined together. A liquid gallium material, illustrated at 46, is applied at the interface between a pair of conductive studs 48 and 50 already formed in segmented sections 52 and 54, respectively.

The unit is then subjected to a heat cycle and pressure, pressure being schematically illustrated by the arrows 58. Suitable heat cycles have been realized at 220° C for approximately 3 hours, or at 150° C for 16 hours, by way of example, and the following metallurgical action occurs during this cycle.

Gallium is a material which has a melting point or reflow point of approximately 30° C. As it is placed through the heat cycle, an interdiffusion occurs between the gallium material and the copper studs. During the initial portion of the heat cycle, the copper studs and the gallium material form a liquid metallic system. However, within a very short period of time into the heat cycle, the liquid metallic system transforms into a solid system. The resulting solid system possesses a melting point much higher than that of the initial 30° C temperature of the starting gallium material. In one specific example, the melting point of the resulting solid system illustrated by the conductive path 60 having a metallurgical interface 62, resulted in a solid system up to a temperature of 900° C, if the interdiffusion rate is maintained over an extended period of time.

Gallium is employed in the preferred embodiment because it is liquid at an extremely low temperature and also diffuses at a relatively low temperature with a high melting point alloy, copper in the preferred embodiment. The ability to proceed at a relatively low diffusion temperature is significant in that it does not threaten the tolerable temperature conditions to which most dielectric materials can be subjected, e.g. epoxy glass.

The process is illustrated only for the formation of a pair of sections and only for the vertical electrical interconnection path. However, as previously illustrated in connection with FIG. 1, the identical process can be employed to simultaneously interconnect any number of segmented sections, having desired interconnection paths comprising vertical plated-through via holes, ground planes and signal planes.

Further, the specific process illustrated in FIG. 2 shows a fairly wide separation between the pair of segmented sections. However, it is to be realized that this distance can be virtually completely eliminated by plating the conductive studs such that they terminate coplanar with the horizontal surface of the segmented sections.

FIG. 2 shows a pair of dielectric segmented sections 70 and 72 joined in accordance with the process illustrated in FIG. 2. A pair of vertical interconnection paths 74 and 76 having a metallurgical diffused interface 78 and 80, respectively, provide interconnection from one level to another. Horizontal metallized patterns joined to the dielectric or insulating layers 70 and 72 are illustrated at 78 and 80, respectively. An insulating interface layer 82 of any desired dimension and material, electrically insulates the horizontal conductive patterns 70 and 72. Again, the thickness of layer 82 is determined by the amount which the plated-through via holes extend above the planar surface of the sections 70 and 72. Suitable dielectric materials such as ceramic, quartz, polyamide glass, air, and teflon can be selected for the layer 82.

Copper material is illustrated in the preferred embodiment to form the vertical conductive paths, as well as the horizontal electrical patterns. However, other conductive materials such as gold, silver and nickel or any other electrical conductive material having mobile diffusion characteristics at the interconnection temperature can be used in place of the copper material.

While the invention has been particularly shown and described with reference to the particular embodiment thereof, it will be understood by those skilled in the art that the foregoing and other changes in form and detail may be made therein without departing from the spirit and scope thereof.

What is claimed is:

1. An interconnection substrate for electrical circuits comprising:

a. a dielectric body including a plurality of layers, b. a plurality of substantially planar metallized patterns disposed within said body between at least some of said layers, and at least a pair of planar metallized patterns being in confronting relationship, c. a plurality of metallic conductive paths extending through said body and being disposed substantially normal to said planar metallized patterns, at least some of said conductive paths being connected to at least one of said planar metallized patterns, at least one of said conductive paths comprising a plurality of separate studs joining one another end to end, and d. diffused integral metallurgical bonds between at least some of said studs, said metallurgical bonds comprising a system of the metal constituted by said studs and another metal having a significantly lower melting point than the metal of the conductive paths, and an additional diffused integral metallurigcal bond between said pair of confronting planar metallized patterns, comprising a system of the metal consisting of the planar metallized pattern and additional quantities of said another metal.

2. An interconnection substrate for electrical circuits as in claim 1 wherein:

a. said another metal comprises gallium.

3. An interconnection substrate for electrical circuits as in claim 1 wherein:

a. said an additional diffused integral metallurgical bond is disposed as an interface between a pair of planar metallized patterns for providing electrical conduction and structural bonding between said pair of planar metallized patterns.

4. An interconnection substrate for electrical circuits as in claim 1 wherein:

a. said metallurgical bonds between said conductive paths are disposed between said conductive paths for spacing apart a pair of adjacent ones of said planar metallized patterns from each other.

5. An interconnection substrate for electrical circuits as in claim 4 further including:

a. a dielectric medium interposed between said pair of offset planar metallized patterns.

6. An interconnection substrate for electrical circuits as in claim 5 wherein:

a. said dielectric medium comprises a solid material.

7. An interconnection substrate for electrical circuits as in claim 6 wherein:

a. said dielectric medium comprises air.

8. A method for forming an interconnection substrate for electrical circuits comprising the steps of:

a. forming a plurality of planar sections, each section comprising a dielectric material having a plurality of conductive paths forming a grid therethrough, forming planar metallized patterns on selected ones of said sections, and disposing selectively said metallized patterns in electrical contact with said grid of conductive paths.

b. applying liquid gallium at selected interfaces intermediate conductive paths of adjacent mated sections to form conductive paths between said sections, and selectively applying liquid gallium between a first adjacent pair of planar metallized patterns, c. exposing said sections to heat for forming a plurality of diffused metallurgical bonds at said interfaces, and for forming a first diffused integral metallurgical bond between said pair of adjacent metallized patterns, said metallurgical bonds providing structural integrity as well as an electrical path, and said heating step being effective to join said segmented sections into a unitary body.

9. A method for forming an interconnection substrate for electrical circuits as in claim 8 further comprising the step of:

a. selectively applying liquid gallium between a second adjacent pair of metallized patterns at said selected interfaces formed by said grid of conductive paths for spacing apart said another pair of adjacent metallized patterns from each other.

10. A method for forming an interconnection substrate for electrical circuits as in claim 8 further including the step of:

a. inserting a dielectric medium between said second spaced apart pair of adjacent metallized planes.

11. A method for forming an interconnection substrate for electrical circuits as in claim 10 further including the step of:

a. selecting a solid material as the dielectric medium.

* * * * *